United States Patent
Tran et al.

(10) Patent No.: US 8,867,281 B2
(45) Date of Patent: Oct. 21, 2014

(54) HYBRID CHARGEPUMP AND REGULATION MEANS AND METHOD FOR FLASH MEMORY DEVICE

(71) Applicant: Silicon Storage Technology, Inc., San Jose, CA (US)

(72) Inventors: Hieu Van Tran, San Jose, CA (US); Anh Ly, San Jose, CA (US); Thuan Vu, San Jose, CA (US); Hung Quoc Nguyen, Fremont, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 13/958,410

(22) Filed: Aug. 2, 2013

(65) Prior Publication Data

US 2014/0269049 A1    Sep. 18, 2014

Related U.S. Application Data

(60) Provisional application No. 61/792,643, filed on Mar. 15, 2013.

(51) Int. Cl.
*G11C 16/00* (2006.01)
*H02M 3/156* (2006.01)
*G11C 16/06* (2006.01)
*G11C 5/14* (2006.01)

(52) U.S. Cl.
CPC ............... *G11C 16/06* (2013.01); *H02M 3/156* (2013.01); *G11C 5/145* (2013.01)
USPC ................... 365/185.33; 365/185.23; 365/226

(58) Field of Classification Search
CPC .......... G11C 5/14; G11C 5/145; G11C 5/147; G11C 16/06; G11C 16/30; H02M 3/156
USPC ............................... 365/185.33, 185.23, 226
See application file for complete search history.

(56) References Cited

U.S. PATENT DOCUMENTS

| | | | | |
|---|---|---|---|---|
| 5,999,475 A | * | 12/1999 | Futatsuya et al. | 365/226 |
| 6,424,570 B1 | * | 7/2002 | Le et al. | 365/185.18 |
| 6,538,930 B2 | * | 3/2003 | Ishii et al. | 365/189.09 |
| 6,912,159 B2 | * | 6/2005 | Osawa et al. | 365/185.18 |
| 6,985,397 B2 | * | 1/2006 | Tokui et al. | 365/226 |
| 7,868,375 B2 | | 1/2011 | Liu et al. | |
| 8,605,518 B2 | * | 12/2013 | Takahashi et al. | 365/189.05 |
| 2013/0148456 A1 | * | 6/2013 | Cho et al. | 365/226 |

* cited by examiner

*Primary Examiner* — Tan T. Nguyen
(74) *Attorney, Agent, or Firm* — Brent Yamashita; DLA Piper LLP US (57) ABSTRACT

A hybrid charge pump and control circuit for use in a memory device is disclosed.

31 Claims, 10 Drawing Sheets

HYBRID CHARGEPUMP AND REGULATION MEANS AND METHOD FOR FLASH MEMORY DEVICE

PRIORITY CLAIM

This application claims priority under 35 U.S.C. Section 119 and 120 to U.S. Provisional Patent Application Ser. No. 61/792,643 filed on Mar. 15, 2013, which is incorporated by reference herein.

TECHNICAL FIELD

A hybrid charge pump and control circuit for use in a memory device is disclosed.

BACKGROUND OF THE INVENTION

Flash memory cells using a floating gate to store charges thereon and memory arrays of such non-volatile memory cells formed in a semiconductor substrate are well known in the art. Typically, such floating gate memory cells have been of the split gate type, or stacked gate type.

Figure 1:
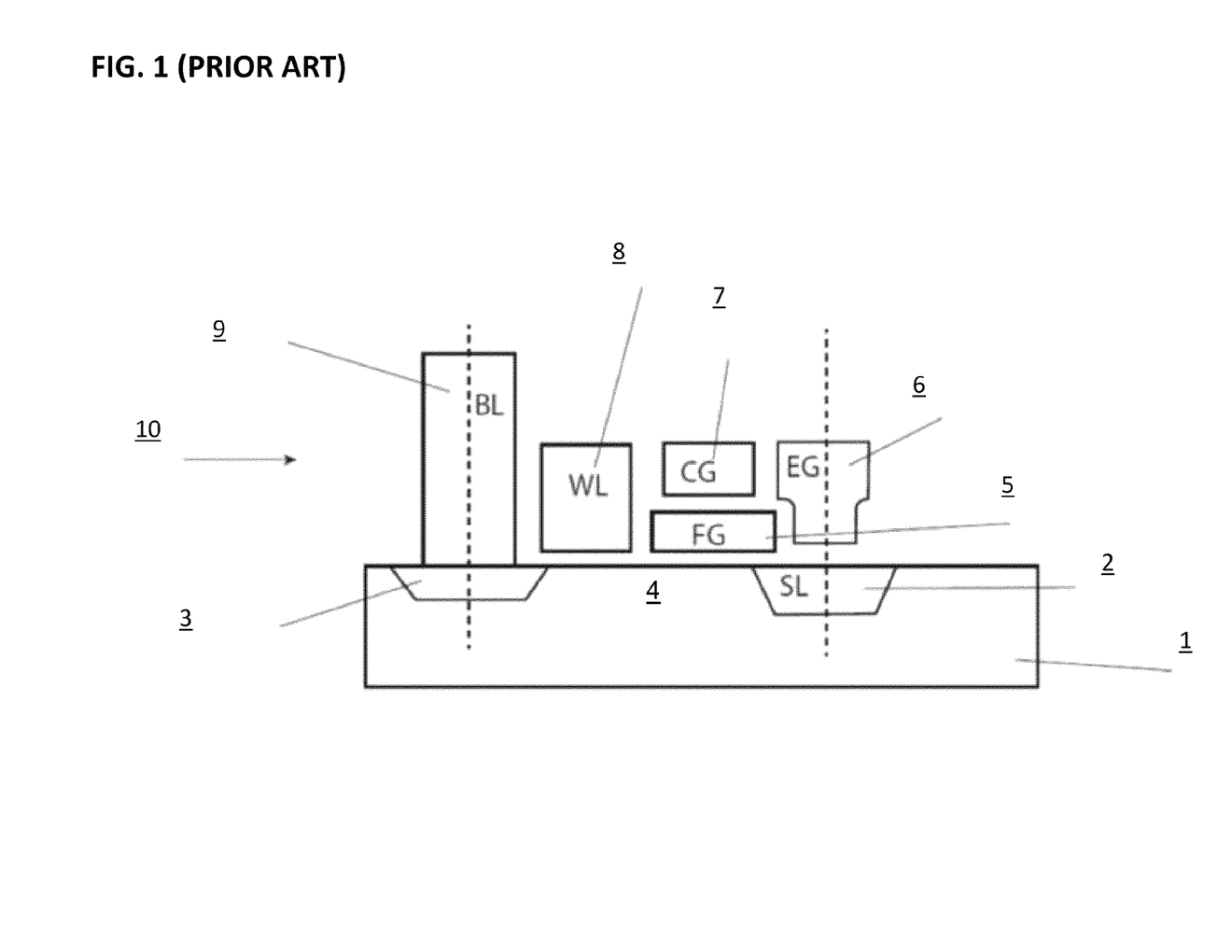
FIG. 1 depicts a prior art split gate flash memory cell.

One prior art non-volatile memory cell 10 is shown in FIG. 1. The split gate SuperFlash (SF) memory cell 10 comprises a semiconductor substrate 1 of a first conductivity type, such as P type. The substrate 1 has a surface on which there is formed a first region 2 (also known as the source line SL) of a second conductivity type, such as N type. A second region 3 (also known as the drain line) also of a second conductivity type, such as N type, is formed on the surface of the substrate 1. Between the first region 2 and the second region 3 is a channel region 4. A bit line (BL) 9 is connected to the second region 3. A word line (WL) 8 (also referred to as the select gate) is positioned above a first portion of the channel region 4 and is insulated therefrom. The word line 8 has little or no overlap with the second region 3. A floating gate (FG) 5 is over another portion of the channel region 4. The floating gate 5 is insulated therefrom, and is adjacent to the word line 8. The floating gate 5 is also adjacent to the first region 2. A coupling gate (CG) 7 (also known as control gate) is over the floating gate 5 and is insulated therefrom. An erase gate (EG) 6 is over the first region 2 and is adjacent to the floating gate 5 and the coupling gate 7 and is insulated therefrom. The erase gate 6 is also insulated from the first region 2.

One exemplary operation for erase and program of prior art non-volatile memory cell 10 is as follows. The cell 10 is erased, through a Fowler-Nordheim tunneling mechanism, by applying a high voltage on the erase gate EG 6 with other terminals equal to zero volt. Electrons tunnel from the floating gate FG 5 into the erase gate EG 6 causing the floating gate FG 5 to be positively charged, turning on the cell 10 in a read condition. The resulting cell erased state is known as '1' state. Another embodiment for erase is by a applying a positive voltage Vegp on the erase gate EG 6, a negative voltage Vcgn on the coupling gate CG 7, and others terminal equal to zero volts. The negative voltage Vcgn couples negatively the floating gate FG 5, hence less positive voltage Vcgp is required for erasing. Electrons tunnel from the floating gate FG 5 into the erase gate EG 6 causing the floating gate FG 5 to be positively charged, turning on the cell 10 in a read condition (cell state '1'). Alternately the wordline WL 8 (Vwle) and the source line SL 2 (Vsle) can be negative to further reduce the positive voltage on the erase gate FG 5 needed for erase. The magnitude of negative voltage Vwle and Vsle in this case is small enough not to forward the p/n junction. The cell 10 is programmed, through a source side hot electron programming mechanism, by applying a high voltage on the coupling gate CG 7, a high voltage on the source line SL 2, a medium voltage on the erase gate EG 6, and a programming current on the bit line BL 9. A portion of electrons flowing across the gap between the word line WL 8 and the floating gate FG 5 acquire enough energy to inject into the floating gate FG 5 causing the floating gate FG 5 to be negatively charged, turning off the cell 10 in read condition. The resulting cell programmed state is known as '0' state.

The cell 10 can be inhibited in programming (if, for instance, another cell in its row is to be programmed but cell 10 is to not be programmed) by applying an inhibit voltage on the bit line BL 9. The cell 10 is more particularly described in U.S. Pat. No. 7,868,375, whose disclosure is incorporated herein by reference in its entirety.

Exemplary operating voltages for the prior art design of FIG. 1 is shown below in

TABLE 1

| Operation | WL | CG | FG | BL | SL |
|---|---|---|---|---|---|
| Read | Vwlrd | Vcgrd | Vegrd | Vblrd | 0V |
| Program | Vwlp | Vcgp | Vegp | Iprog or Vinh | Vslp |
| Erase | 0V/Vwle | 0V/Vcge | Vege | 0V | 0V/Vsle |
| Standby | 0V | 0V or Vcgrd | 0V or Vegrd | 0V | 0V |

Typical values for the values listed in Table 1 are shown in Table 2:

TABLE 2

| Voltage Label | Voltage |
|---|---|
| Vwlrd | ~1-2 V |
| Vcgrd | ~1-2 V |
| Vegrd | ~1-2 V |
| Vblrd | ~0.2-1 V |
| Vwlp | ~0.5-1 V |
| Vcgp | ~9-10 V |
| Vegp | ~4-5 V |
| Iprog | ~0.2-2 µA |
| Vslp | ~4-5 V |
| Vinh | ~2 V |
| Vege | ~7-11.5 V |
| Vcge | ~-7 to -9 V |
| Vegp | ~7 to 9 V |
| Vwle | ~-0.4 V |
| Vsle | ~-0.4 V |

Figure 2:
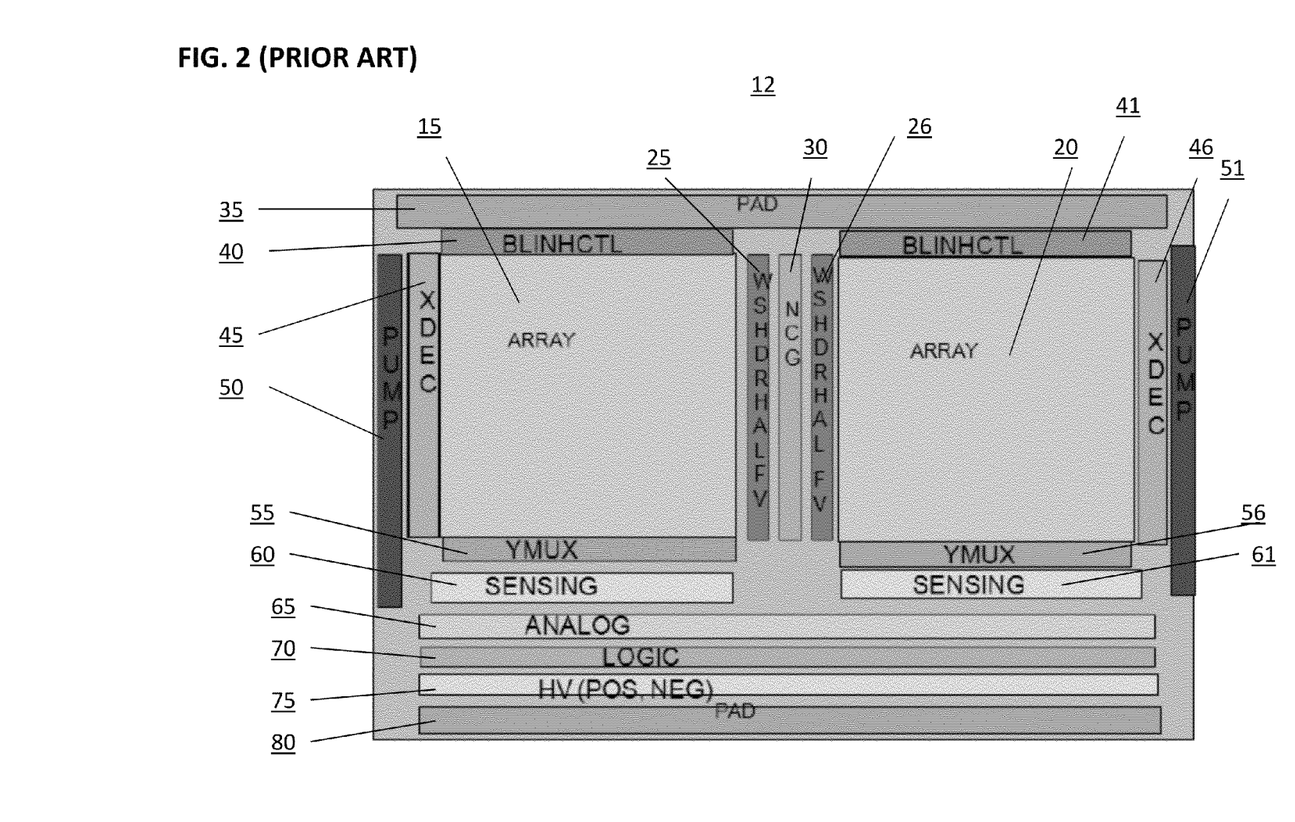
FIG. 2 depicts a prior art layout for a flash memory device.

FIG. 2 depicts a typical prior art architecture for a two-dimensional prior art flash memory system. Die 12 comprises: memory array 15 and memory array 20 for storing data, the memory array optionally utilizing memory cell 10 as in FIG. 1; pad 35 and pad 80 for enabling electrical communication between the other components of die 12 and, typically, wire bonds (not shown) that in turn connect to pins (not shown) or package bumps that are used to access the integrated circuit from outside of the packaged chip; high voltage circuit 75 used to provide positive and negative voltage supplies for the system; control logic 70 for providing various control functions, such as redundancy and built-in self-testing; analog logic 65; sensing circuits 60 and 61 used to read data from memory array 15 and memory array 20, respectively; row decoder circuit 45 and row decoder circuit 46 used to access the row in memory array 15 and memory array 20, respectively, to be read from or written to; column decoder 55 and column decoder 56 used to access the column in memory array 15 and memory array 20, respectively, to be read from or written to; charge pump circuit 50 and charge pump circuit 51, used to provide increased voltages for program and erase operations for memory array 15 and memory array 20, respectively; high voltage driver circuit 30 shared by memory array 15 and memory array 20 for read and write (erase/program) operations; high voltage driver circuit 25 used by memory array 15 during read and write operations and high voltage driver circuit 26 used by memory array 20 during read and write (erase/program) operations; and bitline inhibit voltage circuit 40 and bitline inhibit voltage circuit 41 used to un-select bitlines that are not intended to be programmed during a write operation for memory array 15 and memory array 20, respectively. These functional blocks are understood by those of ordinary skill in the art, and the block layout shown in FIG. 2 is known in the prior art.

As can be seen from the foregoing, charge pumps play an important role in the operation of flash memory devices. High voltages are required for the program and erase functions.

Figure 3:
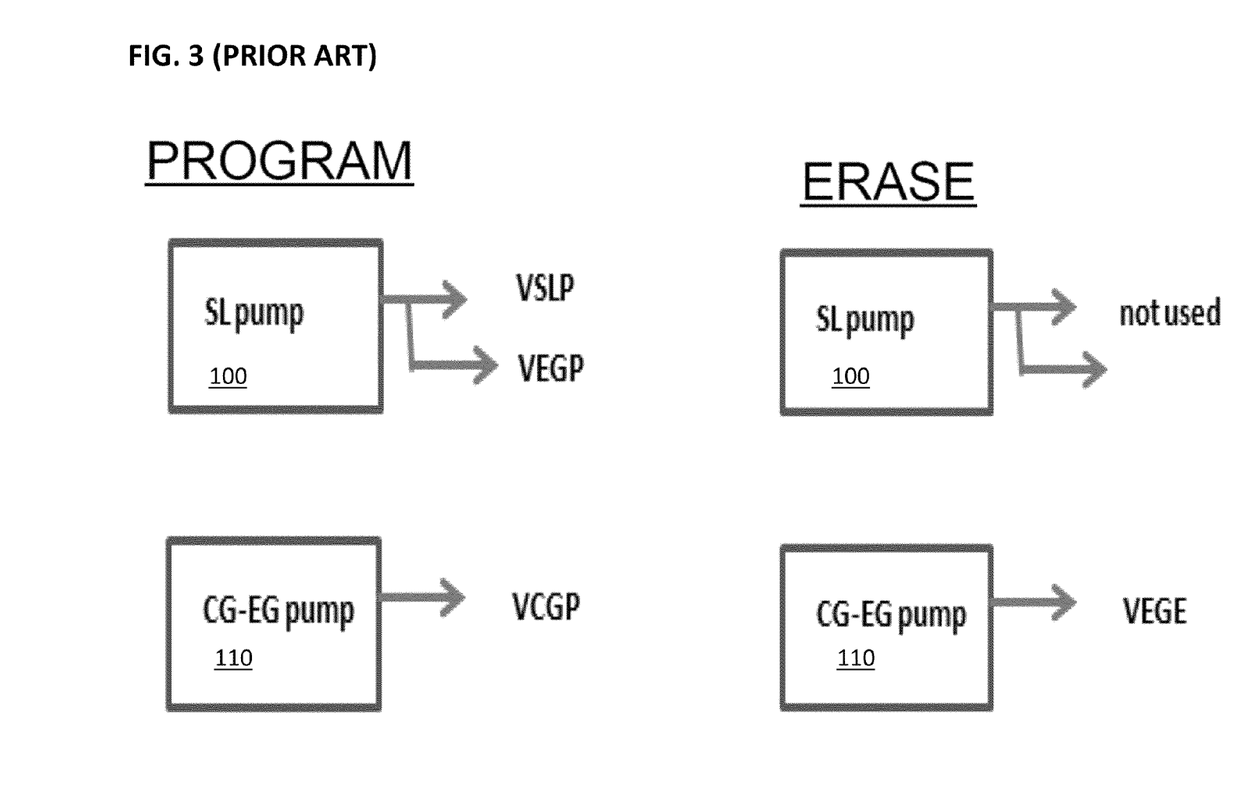
FIG. 3 depicts prior art charge pumps.

FIG. 3 depicts prior art charge pumps. During a program operation, SL pump 100 is used to generate the Vslp and Vegp voltages (which are typically around 4V to 5V), and CG-EG pump 110 is used to generate the Vcgp voltage (which is typically around 9V to 10V). During an erase operation, SL pump 100 is not used, and CG-EG pump is used to generate the Vege voltage (which is typically around 10 to 11.5V). These voltages are relatively high voltages that consume significant levels of power.

What is needed are improved charge pumps that can generate voltages for the program and erase operations in flash memory devices that are lower voltages than those used in prior art charge pumps.

SUMMARY OF THE INVENTION

The aforementioned problems and needs are addressed through improved charge pump embodiments. In one embodiment, one charge pump produces a positive voltage and one charge pump produces a negative voltage. In another embodiment, a hybrid charge pump optionally can generate a high voltage or be split into two charge pumps, each generating a voltage less in magnitude than the high voltage. In another embodiment, a charge pump control circuit is disclosed. In other embodiments, inverter circuits for use with charge pumps are disclosed.

DETAILED DESCRIPTION OF THE PREFERRED EMBODIMENTS

Figure 4:
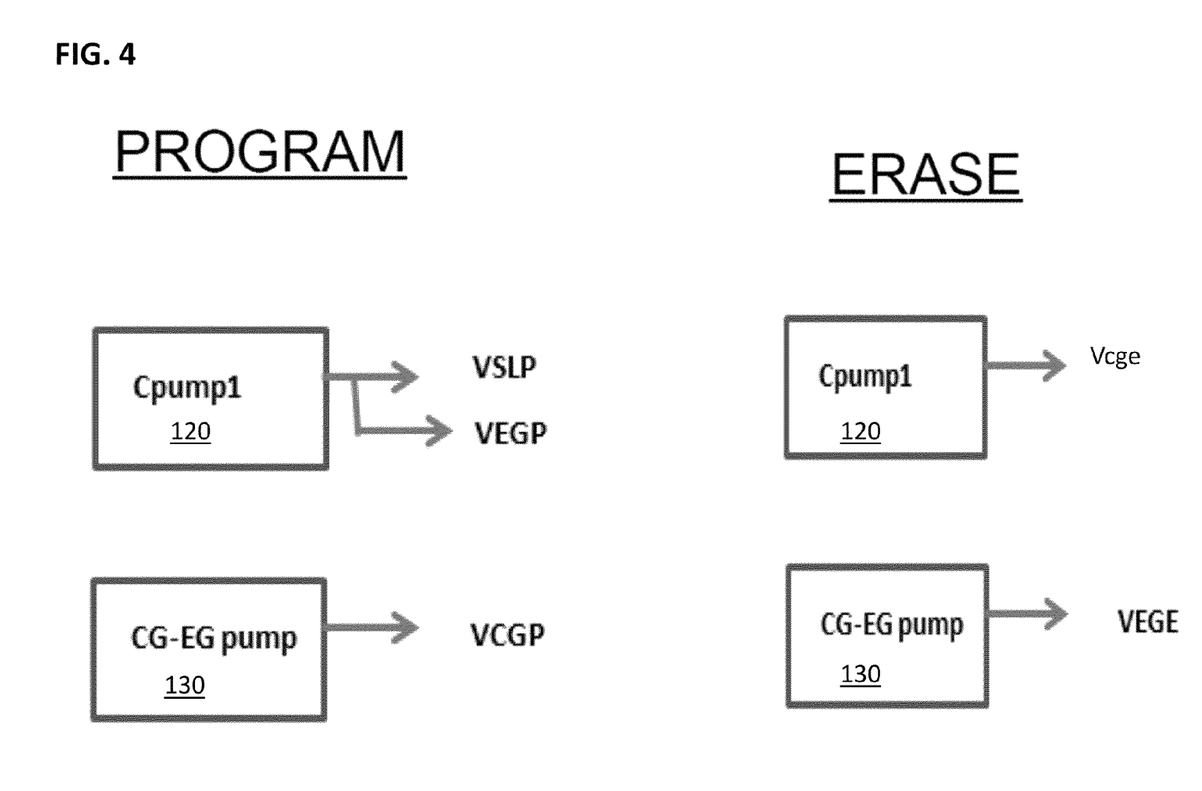
FIG. 4 depicts charge pump embodiments.

FIG. 4 depicts improved charge pump embodiments. During a program operation, Cpump1 120 generates Vslp and Vegp (which typically are around 4-5V as in the prior art), and CG-EG pump 130 generates Vcgp (which typically is around 4-5V as in the prior art). However, during an erase operation, Cpump1 120 generates Vcge (which is around −8V), and CG-EG pump 130 generates Vege (which is around 8V). Thus, during an erase operation, around 8V will be applied to erase gate 6 and around −8V will be applied to control gate 7. Alternatively a negative voltage can be applied (e.g., −04v) on the wordline 8 (vwle) and source line 2 (Vsle) respectively with the negative voltage derived from the Cpump1 120.

Figure 5:
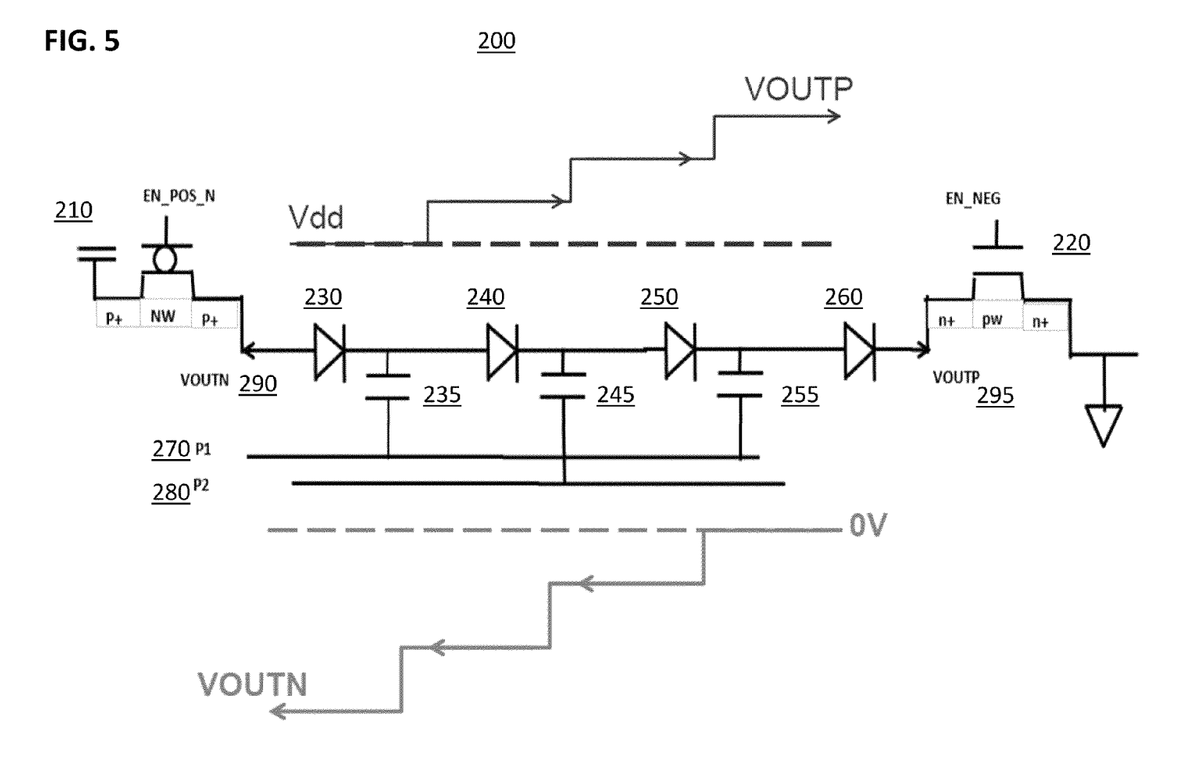
FIG. 5 depicts a circuit design for a charge pump embodiment.

FIG. 5 depicts charge pump circuit 200. Charge pump circuit 200 comprises switch 210, switch 220, voltage source phase driver 270, voltage source phase driver 280, and three charging stages (each comprising a diode and capacitor, the pairing of which depending on which switch is turned on) comprising diode 230, diode 240, diode 250, diode 260, capacitor 235, capacitor 245, and capacitor 255. When switch 210 is turned on and switch 220 is turned off, positive charging will occur, and Voutp 295 will contain a positive voltage (such as 8V), in which instance charge pump circuit 200 can serve as CG-EG pump 130 to generate Vege. When switch 210 is turned off and switch 220 is turned on, negative charging will occur, and Voutn 290 will contain a negative voltage (such as −8V), in which instance charge pump circuit 200 can serve as Cpump1 120 to generate Vcge. Thus, unlike in the prior art system, the highest voltage generated is 8V instead of 11.5V. This can save on power usage and also can increase the reliability of the flash memory product. Diode 230,240,250, 260 can be made by enhancement NMOS and PMOS transistors or by P/N junction diode. Capacitor 235,245,255 can be made by enhancement NMOS and PMOS transistors or by MOM (metal-oxide-metal) capacitor or combination thereof. The switch 210 is implemented as an enhancement PMOS. Alternative embodiment for switch 210 is NMOS transistor, in this case its bulk p-substrate terminal needs to be isolated from the negative output Voutn 290. The switch 220 is implemented as an enhancement NMOS. Alternative embodiment for switch 220 is PMOS transistor, in this case its bulk Nwell terminal needs to be isolated from the positive output Voutp 295. The phase driver 270 and 280 are generated by a phase driver circuit (not shown) and they are typically non-overlapping clocking phases at typically 10-80 Mhz.

Figure 6:
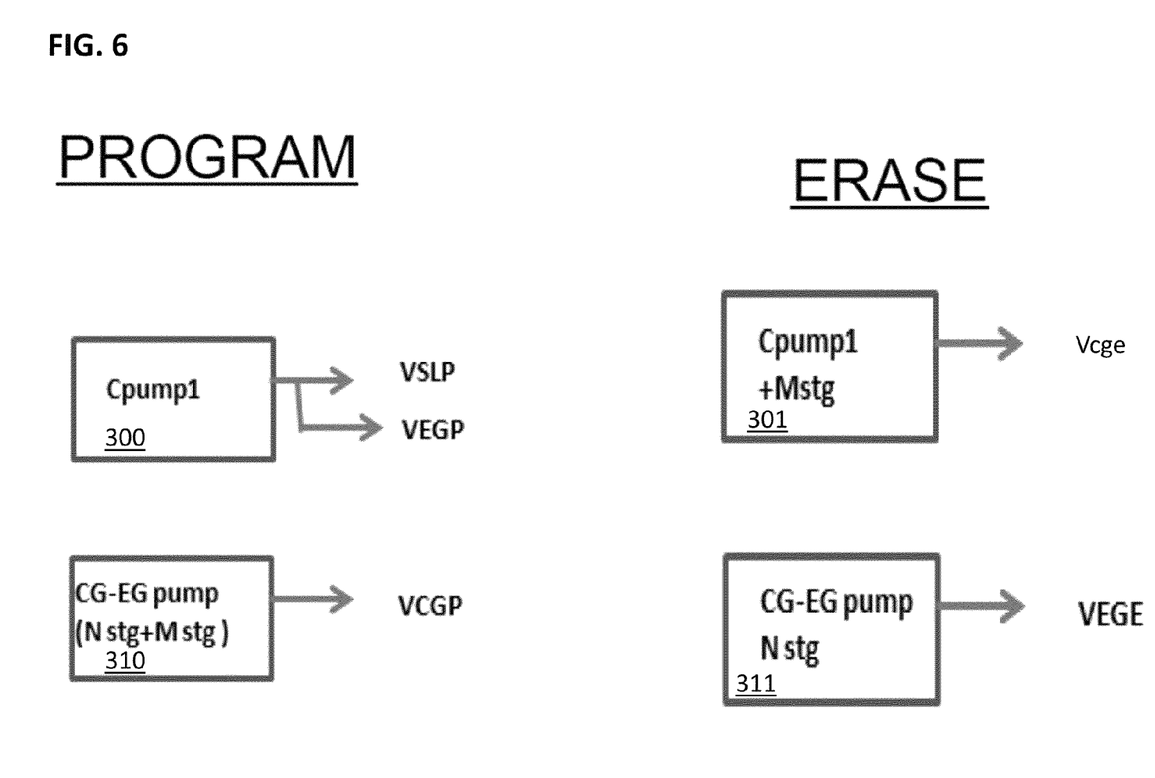
FIG. 6 depicts charge pump embodiments.

Another embodiment is depicted in FIG. 6. During a program operation, Cpump1 300 generates Vslp and Vegp (which typically are around 5V as in the prior art), and CG-EG pump 310 generates Vcgp (which typically is around 5V as in the prior art). However, during an erase operation, Cpump1+Mstg 301 is reconfigured to generate Vcge (which is around −8V), and CG-EG pump+N stg 311 is reconfigured to generate Vege (which is around 8V). The reconfiguration is done by splitting the CG_EG pump 310 into N stage pump and M stage pump. Then by combining M stage pump of the CG_EG pump 310 into the Cpump1 300 to make a new pump 301. The N stage is left with the original CG+EG pump 310 to make a new pump 311 The benefit of this system is that a hybrid charge pump can be used to generate the high Vege voltage but also to generate the much smaller Vcgp and Vcgn voltages.

Figure 7:
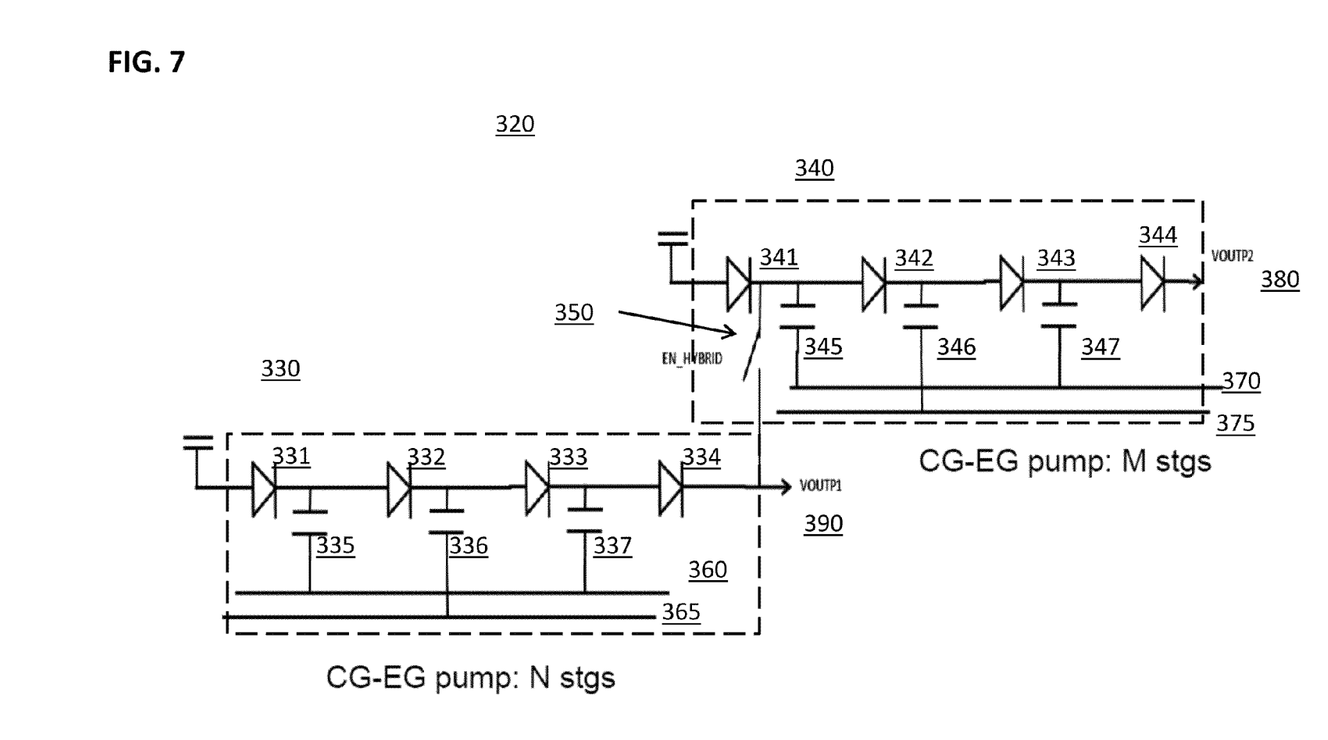
FIG. 7 depicts a circuit design for a hybrid charge pump embodiment.

FIG. 7 depicts the hybrid reconfigurable charge pump 320. Charge pump 320 contains two charge pump components, each of which is its own charge pump. Charge pump component 330 comprises N charging stages (here, N=3, but N can be any positive integer), and charge pump component 340 comprises M charging stages (here, M=3, but M can be any positive integer). Charge pump component 330 and charge pump component 340 are coupled by switch 350. When switch 350 is on, charge pump component 330 and charge pump component 340 are coupled together as one charge pump of N+M charging stages. When switch 350 is off, charge pump component 330 and charge pump component 340 are not coupled together and operate as separate charge pumps. Thus the chargepump 320 can be configured to be a pump with N+M stages or two separate pump, a N stage pump and a M stage pump. The charge pump 320 is for positive operation (pumping to higher positive voltage). Alternative embodiment is for negative operation with similar reconfigurability (as shown in FIG. 5). Different combination negative/positive segment pump for different segment pumps is done such as N stage pump 330 is negative and M stage pump 340 is positive by reconfiguring them.

Charge pump component 330 comprises voltage source phase driver 360, voltage source phase driver 365, diode 331, diode 332, diode 333, diode 334, capacitor 335, capacitor 336, capacitor 337, and generates output 390. Diode 331,332, 333,334 can be made by enhancement NMOS and PMOS transistors or by P/N junction diode. Capacitor 335,336,337 can be made by enhancement NMOS and PMOS transistors or by MOM (metal-oxide-metal) capacitor or combination thereof. The phase driver 360 and 365 are generated by a phase driver circuit (not shown) and they are typically non-overlapping clocking phases at typically 10-80 Mhz.

Charge pump component 340 comprises voltage source phase driver 370, voltage source phase driver 375, diode 341, diode 342, diode 343, diode 344, capacitor 345, capacitor 346, capacitor 347, and generates output 380. Diode 341,342, 343,344 can be made by enhancement NMOS and PMOS transistors or by P/N junction diode. Capacitor 345,346,347 can be made by enhancement NMOS and PMOS transistors or by MOM (metal-oxide-metal) capacitor or combination thereof. The phase driver 370 and 375 are generated by a phase driver circuit (not shown) and they are typically non-overlapping clocking phases at typically 10-80 Mhz.

Figure 8:
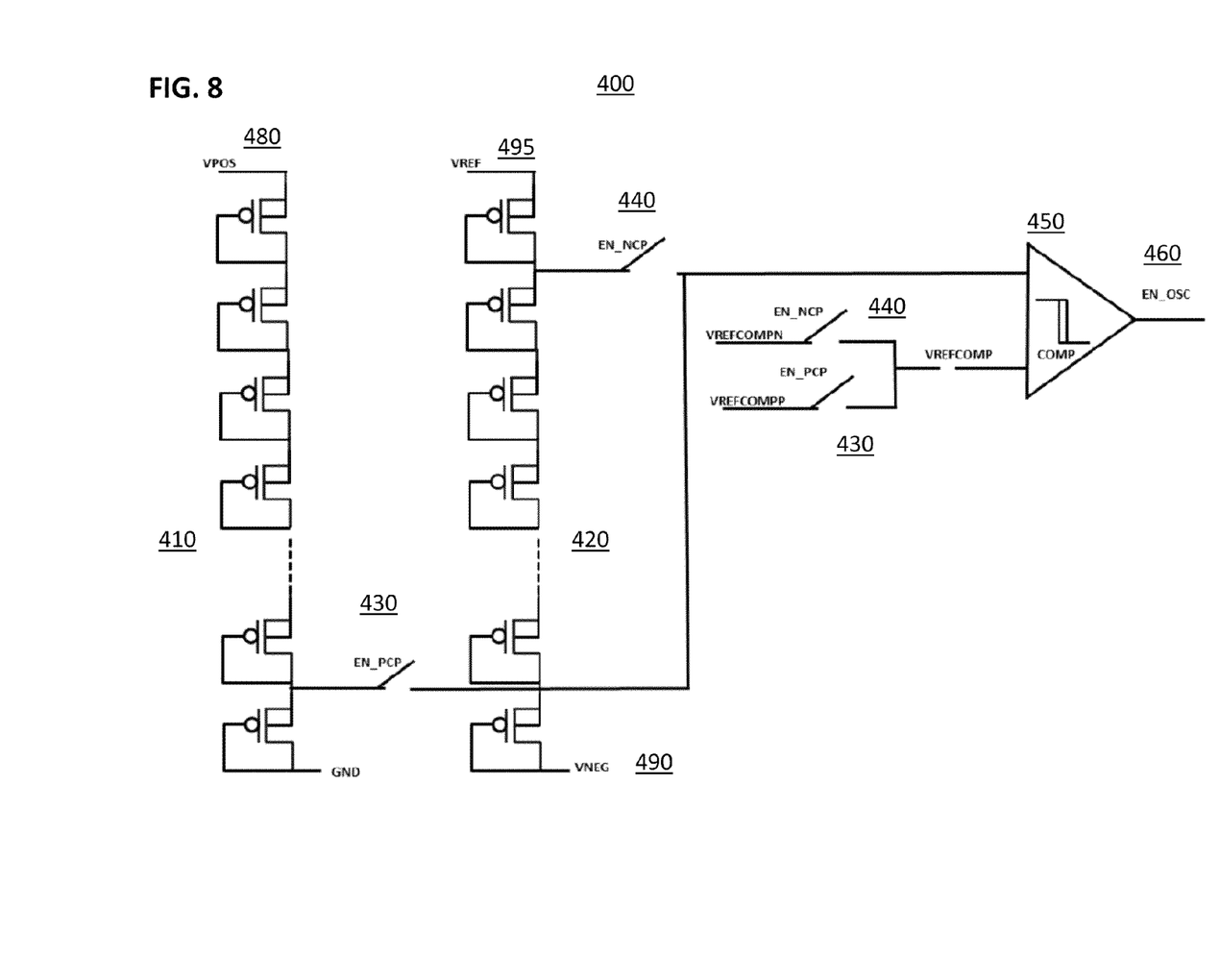
FIG. 8 depicts a control circuit for a charge pump.

FIG. 8 depicts hybrid charge pump control circuit 400. Charge pump control circuit takes a charge pump output, steps it down (or up, for negative voltages), compares the result to reference voltage, and then generates an enable signal that will continue the charge pump operation when high and will discontinue the charge pump operation when low.

When the voltage of interest is positive, such as VPOS 480, switches 430 are turned on, and switches 440 are turned off. VPOS 480 is supplied to a sequence of transistors 410, whereby VPOS 480 is diminished by a threshold voltage through each transistor. The result is compared to a reference voltage by comparator 450. If the reference voltage is greater than the stepped-down VPOS voltage, then enable signal 460 is asserted. Enable signal 460 can be sent to a charge pump oscillator (not shown which feeds into a phase driver circuit to generate phase driver clocks such as signal 270 and 280 in FIG. 5) which will keep the charge pump operating. If the reference voltage is lower than the stepped-down VPOS voltage, then enable signal 460 is de-asserted, and the charge pump will stop operating.

When the voltage of interest is negative, such as VNEG 490, switches 440 are turned on, and switches 430 are turned off. VNEG 490 is supplied to a sequence of transistors 420, whereby VNEG is increased by a threshold voltage through each transistor. The result is compared to a reference voltage by comparator 450. If the reference voltage is lower than the stepped-up VNEG voltage, then enable signal 460 is asserted. Enable signal 460 can be sent to a charge pump oscillator (not shown) which will keep the charge pump operating. If the reference voltage is higher than the stepped-up VNEG voltage, then enable signal 460 is de-asserted, and the charge pump will stop operating.

Figure 9:
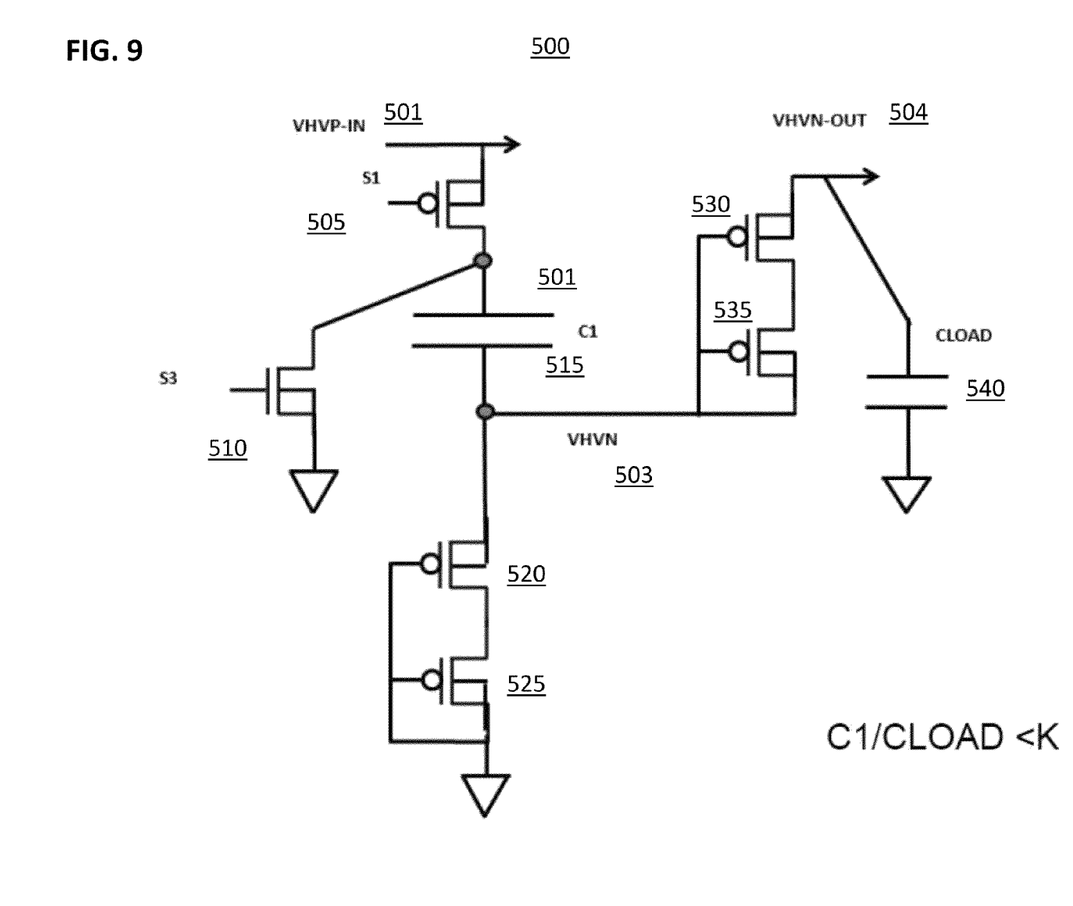
FIG. 9 depicts an inverter for use with a charge pump.

FIG. 9 depicts an inverter circuit 500 that inverts the output of a charge pump. For example, if VHVP-IN 501 is +10V, VHVN-OUT will be −10V. Inverter circuit 500 comprises PMOS transistor 505, NMOS transistor 510, capacitor 515, PMOS transistor 520, PMOS transistor 525, PMOS transistor 530, PMOS transistor 535, and output capacitor 540. These components are coupled together as shown in FIG. 9. The operation is as following. First PMOS transistor 505 is enabled to charge up terminal 501 of the capacitor 515 to the VHVP-IN 501 level. The node VHVN 503 will be clamped at a Vt (threshold voltage of the PMOS transistor 520,525) above ground. Next the PMOS transistor 505 is turned off and the NMOS transistor 510 is turned on, which in turns pull the terminal 501 to ground, by capacitor coupling action, the node 503 will be pulled to negative, then in turn it pulls output node 504 to negative by the PMOS transistors 530 and 535. Then the sequence repeats until the output node 504 is substantially equal to VHV-P IN 501.

Figure 10:
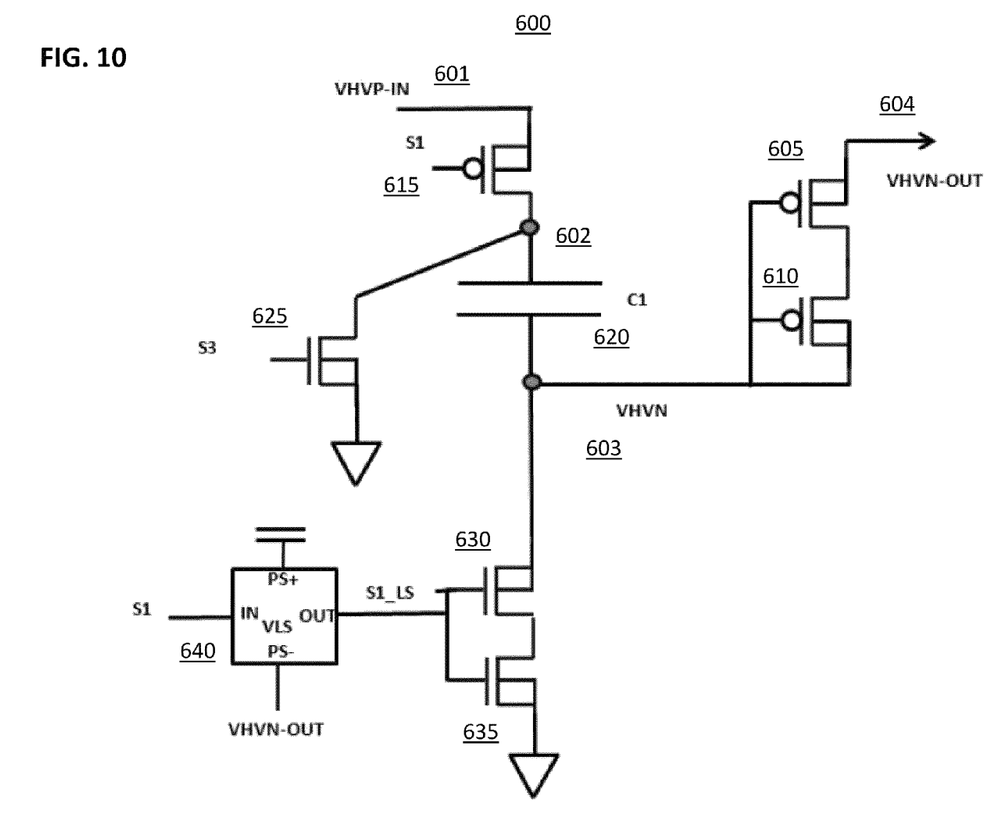
FIG. 10 depicts an inverter for use with a charge pump.

FIG. 10 depicts another inverter circuit 600 that inverts the output of a charge pump. For example, if VHVP-IN 601 is +10V, VHVN-OUT 604 will be −10V Inverter circuit 600 comprises PMOS transistor 605, PMOS transistor 610, PMOS transistor 615, capacitor 620, NMOS transistor 625, NMOS transistor 630, NMOS transistor 635, and switch 640. These components are coupled together as shown in FIG. 10. The operation is similar to that of FIG. 9. The NMOS transistors 630,635 together with the switch 640 now controls node 603 to ground at the charging phase.

References to the present invention herein are not intended to limit the scope of any claim or claim term, but instead merely make reference to one or more features that may be covered by one or more of the claims. Materials, processes and numerical examples described above are exemplary only, and should not be deemed to limit the claims. It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between). For example, forming an element "over a substrate" can include forming the element directly on the substrate with no intermediate materials/elements there between, as well as forming the element indirectly on the substrate with one or more intermediate materials/elements there between.

What is claimed is:

1. A hybrid charge pump for a flash memory device, comprising:
   a first charge pump comprising N charging stages, wherein N is a positive integer;
   a second charge pump comprising M charging stages, wherein M is a positive integer; and
   a switch coupling the first charge pump and the second charge pump;
   wherein when the switch is on, the first charge pump and second charge pump together comprise a third charge pump with N+M charging stages, and when the switch is off, the first charge pump and second charge pump act as separate charge pumps providing a positive voltage output and a negative voltage output.

2. The hybrid charge pump of claim 1, wherein each of the N charging stages comprise a diode and a capacitor.

3. The hybrid charge pump of claim 2, wherein each of the M charging stages comprise a diode and a capacitor.

4. The hybrid charge pump of claim 1, wherein the third charge pump provides a positive voltage for programming flash memory.

5. The hybrid charge pump of claim 4, wherein the flash memory is split gate flash memory.

6. The hybrid charge pump of claim 1, wherein the second charge pump is further combined with another charge pump and is reconfigured to provide a negative voltage for erasing flash memory.

7. The hybrid charge pump of claim 6 wherein the first charge pump is configured to provide a positive voltage for erasing flash memory.

8. The hybrid charge pump of claim 7, wherein the flash memory is split gate flash memory.

9. The hybrid charge pump of claim 6, wherein the flash memory is split gate flash memory.

10. A charge pump for a flash memory device, comprising:
a first switch coupled to a first voltage input;
a second switch coupled to a second voltage input;
a plurality of charging stages coupled to the first switch and the second switch and comprising a first output node and a second output node;
wherein when the first switch is on and the second switch is off, the first output node outputs a positive voltage larger than the voltage of the first voltage input, and when the first switch is off and the second switch is on, the second output node outputs a negative voltage lower than the voltage of the second voltage input.

11. The charge pump of claim 10, wherein the second voltage input is ground.

12. The charge pump of claim 10, wherein each charging stage of the plurality of charging stages comprises a diode and a capacitor.

13. The charge pump of claim 12, wherein at least one capacitor is coupled to a first voltage source phase driver.

14. The charge pump of claim 13, wherein at least one capacitor is coupled to a second voltage source phase driver.

15. The charge pump of claim 10, wherein the first switch comprises a PMOS transistor.

16. The charge pump of claim 15, wherein the second switch comprises an NMOS transistor.

17. A hybrid charge pump control circuit for a flash memory device, comprising:
a first input;
a second input;
a first switch;
a second switch;
a first set of transistors for stepping down the voltage of the first input;
a second set of transistors for stepping up the voltage of the second input;
a first reference voltage;
a second reference voltage;
a comparator for comparing the first reference voltage with an output of the first set of transistors when the first switch is on and the second switch is off and for comparing the second reference voltage with an output of the second set of transistors when the first switch is off and the second switch is on, wherein the comparator generates an output for controlling a charge pump.

18. The circuit of claim 17, wherein the voltage of the first input is positive.

19. The circuit of claim 18, wherein the voltage of the second input is negative.

20. The circuit of claim 17, wherein each transistor in the first set of transistors is a PMOS transistor.

21. The circuit of claim 20, wherein each transistor in the second set of transistors is a PMOS transistor.

22. The circuit of claim 17, wherein the first reference voltage is coupled to the comparator through a third switch.

23. The circuit of claim 22, wherein the second reference voltage is coupled to the comparator through a fourth switch.

24. A voltage inverter circuit for a flash memory device, comprising:
a first switch comprising a first terminal connected to an input of the inverter circuit and a second terminal connected to a first capacitor;
a second switch comprising a first terminal connected to the first capacitor and a second terminal connected to ground;
a first set of one or more transistors coupled between the first capacitor and ground; and
a second set of one or more transistors coupled between the first capacitor and an output of the inverter circuit,
wherein the inverter circuit inverts a voltage on the input to generate a voltage on the output.

25. The inverter circuit of claim 24, further comprising a second capacitor coupled to the output and to ground.

26. The inverter circuit of claim 24, wherein the transistors in the first set of one or more transistors are PMOS transistors.

27. The inverter circuit of claim 26, wherein the transistors in the second set of one or more transistors are PMOS transistors.

28. The inverter circuit of claim 24, wherein the transistors in the first set of one or more transistors are NMOS transistors.

29. The inverter circuit of claim 28, wherein the transistors in the second set of one or more transistors are PMOS transistors.

30. The inverter circuit of claim 29, further comprising a switch configured to control the first set of one or more transistors.

31. The inverter circuit of claim 28, further comprising a switch configured to control the first set of one or more transistors.

* * * * *